United States Patent
Truax et al.

(10) Patent No.: US 9,412,691 B2
(45) Date of Patent: Aug. 9, 2016

(54) CHIP CARRIER WITH DUAL-SIDED CHIP ACCESS AND A METHOD FOR TESTING A CHIP USING THE CHIP CARRIER

(71) Applicant: GLOBALFOUNDRIES INC., Grand Cayman (KY)

(72) Inventors: Heather M. Truax, Burlington, VT (US); Jared P. Yanofsky, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 7 days.

(21) Appl. No.: 14/558,782

(22) Filed: Dec. 3, 2014

(65) Prior Publication Data
US 2016/0163631 A1    Jun. 9, 2016

(51) Int. Cl.
| G01R 31/02 | (2006.01) |
| H01L 23/498 | (2006.01) |
| H01L 23/00 | (2006.01) |
| H01L 23/48 | (2006.01) |
| G01R 31/28 | (2006.01) |

(52) U.S. Cl.
CPC ...... *H01L 23/49838* (2013.01); *G01R 31/2884* (2013.01); *H01L 23/481* (2013.01); *H01L 23/49811* (2013.01); *H01L 24/49* (2013.01); H01L 2224/48227 (2013.01); H01L 2924/1511 (2013.01); H01L 2924/15153 (2013.01); H01L 2924/15157 (2013.01)

(58) Field of Classification Search
CPC .............................. G01R 1/0483; H01L 23/04
See application file for complete search history.

(56) References Cited

U.S. PATENT DOCUMENTS

| 4,934,944 A | 6/1990 | Kozel et al. |
| 5,666,064 A | 9/1997 | Kasai et al. |
| 5,686,843 A | 11/1997 | Beilstein, Jr. et al. |
| 5,742,168 A | 4/1998 | Kiyokawa et al. |
| 5,874,319 A * | 2/1999 | Dunaway ............. G01R 1/0483 438/14 |
| 6,005,385 A | 12/1999 | Ping |
| 6,639,416 B1 | 10/2003 | Akram et al. |
| 6,983,536 B2 | 1/2006 | Farnworth et al. |
| 7,112,983 B2 | 9/2006 | McGinnis et al. |
| 7,486,525 B2 | 2/2009 | Knickerbocker |
| 8,063,656 B1 | 11/2011 | Ubaldo et al. |

(Continued)

OTHER PUBLICATIONS

MJ Feurer, "Fixture for Precisely Holding Substrates", IBM TDB 06-77, p. 161-162, IP.com No. IPCOM000088435D, Mar. 4, 2005.

(Continued)

*Primary Examiner* — Fernando L Toledo
*Assistant Examiner* — Valerie N Newton
(74) *Attorney, Agent, or Firm* — Gibb & Riley, LLC; Michael J. LeStrange, Esq.

(57) ABSTRACT

Disclosed are chip carriers and methods of using them. The chip carriers each comprise a base with a first surface, a second surface opposite the first surface, and wire bond pads on the first and second surfaces. The first surface also has a chip attach area with opening(s) that extends from the first surface to the second surface. A chip can be attached to the chip attach area and, because of the opening(s), wire bond pads on opposite sides (e.g., on the top and bottom) of the chip are accessible for testing. That is, wire bond pads on the first surface can be electrically connected to one side of the chip (e.g., to the top of the chip) and/or wire bond pads on the second surface can be electrically connected through the opening(s) to the opposite side of the chip (e.g., to the bottom of the chip).

19 Claims, 7 Drawing Sheets

(56) References Cited

U.S. PATENT DOCUMENTS

| | | |
|---|---|---|
| 8,212,580 B2 | 7/2012 | Izadian |
| 8,487,642 B2 | 7/2013 | Sun et al. |
| 8,720,875 B2 | 5/2014 | Di Stefano et al. |
| 2004/0189333 A1 | 9/2004 | Dobritz et al. |

OTHER PUBLICATIONS

EJ Dombroski, "Fixture for Probe Testing Integrated Circuit Chip Carriers", IBM TDB 01-89, p. 392-394, IP.com No. IPCOM000034275D, Jan. 27, 2005.

* cited by examiner

CHIP CARRIER WITH DUAL-SIDED CHIP ACCESS AND A METHOD FOR TESTING A CHIP USING THE CHIP CARRIER

BACKGROUND

The present disclosure relates to testing chips and, more specifically, to a chip carrier with dual-sided chip access for testing and a method for testing of a chip using such a chip carrier.

Electromigration is a failure mechanism that is associated with metal components of a chip (also referred to herein as an integrated circuit (IC) chip or a die). Specifically, electromigration is a condition in which atoms of a metal component or interconnect (e.g., a wire, a via, a through-substrate via (TSV), etc.) are displaced due to passing current. The condition is accelerated when the metal component is exposed to high temperatures and/or high currents and, over time, this condition can cause cracks (i.e., voids, opens, etc.) in the metal component that result in increased resistance and, ultimately, in failure of the metal component. Typically, the reliability of a metal component on a chip is tested using a chip carrier (e.g., a temporary chip attach (TCA) chip carrier). The chip carrier can have a support surface, wire bond pads on the support surface and input/output (I/O) pins electrically connected to the wire bond pads. A chip can be attached to the support surface and wires that are wire bonded to selected chip carrier wire bond pads can be electrically connected to opposite ends of the metal component in any one of several possible ways including, for example: (1) the wires can be directly electrically connected to the opposite ends of the metal component; (2) the wires can be wire bonded to on-chip wire bond pad that are electrically connected to the opposite ends; or (3) the wires can be electrically connected to probes that are in contact with the opposite ends of the metal component. The I/O pins allow for communication with an off-chip tester. Through these electrical connections, the off-chip tester can stress the metal component and, particularly, can subject the metal component to high temperatures and/or high currents and can test the performance of the metal component (e.g., can determine changes in the resistance of the metal component over time and/or can determine the time to fail (TTF) for the metal component). However, for through-substrate vias (TSVs) this reliability testing technique cannot be used because TSVs have opposite ends on opposite sides (e.g., the top and bottom) of the chip.

SUMMARY

In view of the foregoing, disclosed herein are chip carriers that provide dual-sided chip access for testing. Specifically, each chip carrier can comprise a base with opposite surfaces (i.e., a first surface and second surface opposite the first surface) and wire bond pads on those opposite surfaces. Additionally, the first surface of the base can have a chip attach area with at least one opening that extends from the first surface to the second surface. A chip can be attached to the chip attach area and, because of the opening(s), both sides of the chip (i.e., the top and bottom of the chip) are accessible for testing. That is, wire bond pads on the first surface of the base of the chip carrier can be electrically connected to one side of the chip (e.g., to the top of the chip) and/or wire bond pads on the second surface of the base of the chip carrier can be electrically connect through the opening(s) to the opposite side of the chip (e.g., to the bottom of the chip). Also disclosed herein is a method that uses a chip carrier that provides dual-sided chip access to test a chip and, particularly, to test components of the chip including, but not limited to, through-substrate vias (TSVs).

More particularly, disclosed herein is a chip carrier that provides dual-sided chip access for testing. The chip carrier can comprise a base having a first surface and a second surface opposite the first surface. The first surface can have a chip attach area and the chip attach area can have at least one opening that extends from the first surface to the second surface. The chip carrier can further comprise multiple wire bond pads. These wire bond pads can comprise first wire bond pads on the first surface and second wire bond pads on the second surface. The chip carrier can further comprise multiple input/output pins adjacent to the base. These input/output pins can each be longer than the thickness of the base and can each be electrically connected to a first wire bond pad on the first surface and a second wire bond pad on the second surface.

In such a chip carrier, the chip attach area can support a chip so as to allow any of the first wire bond pads on the first surface of the base of the chip carrier to be electrically connected to the first side of the chip (e.g., to the top of the chip). For example, any first wire bond pad on the first surface of the base of the chip carrier can be electrically connected (e.g., by wire bonding) to a first wire and that first wire can, for example, be: (1) wire bonded to an additional first wire bond pad, which is on the first side of the chip and which is electrically connected to an on-chip component; (2) electrically connected to a probe, which is electrically connected to an on-chip component at the first side of the chip; or (3) directly electrically connected to an on-chip component at the first side of the chip. Furthermore, because of the opening(s) in the chip attach area, any of the second wire bond pads on the second surface of the base of the chip carrier can be electrically connected to a second side of the chip (e.g., to the bottom of the chip) through the opening(s). For example, any second wire bond pad on the second surface of the base of the chip carrier can be electrically connected (e.g., by wire bonding) to a second wire and that second wire can, for example, be: (1) wire bonded to an additional second wire bond pad, which is on the second side of the chip and which is electrically connected to an on-chip component; (2) electrically connected to a probe, which is electrically connected to an on-chip component at the second side of the chip; or (3) directly electrically connected to an on-chip component at the second side of the chip.

Disclosed herein is another chip carrier that provides dual-sided chip access for testing. The chip carrier can comprise a base having a first surface, a second surface opposite the first surface, and opposing edges. The first surface can have a recessed chip attach area and the recessed chip attach area can have at least one opening that extends from the first surface to the second surface. The chip carrier can further comprise multiple wire bond pads and, particularly, rows of first wire bond pads on the first surface at the opposing edges and rows of second wire bond pads on the second surface at the opposing edges. The chip carrier can further comprise rows of input/output pins adjacent to the base at the opposing edges. These input/output pins can each be longer than the thickness of the base and can be electrically connected to a first wire bond pad on the first surface and a second wire bond pad on the second surface.

In such a chip carrier, the recessed chip attach area can support a chip so as to allow any of the first wire bond pads on the first surface of the base of the chip carrier to be electrically connected to the first side of the chip (e.g., to the top of the chip). For example, any first wire bond pad on the first surface of the base of the chip carrier can be electrically connected (e.g., by wire bonding) to a first wire and that first wire can, for example, be: (1) wire bonded to an additional first wire bond pad, which is on the first side of the chip and which is electrically connected to an on-chip component; (2) electrically connected to a probe, which is electrically connected to an on-chip component at the first side of the chip; or (3) directly electrically connected to an on-chip component at the first side of the chip. Furthermore, because of the opening(s) in the recessed chip attach area, any of the second wire bond pads on the second surface of the base of the chip carrier can be electrically connected to a second side of the chip (e.g., to the bottom of the chip) through the opening(s). For example, any second wire bond pad on the second surface of the base of the chip carrier can be electrically connected (e.g., by wire bonding) to a second wire and that second wire can, for example, be: (1) wire bonded to an additional second wire bond pad, which is on the second side of the chip and which is electrically connected to an on-chip component; (2) electrically connected to a probe, which is electrically connected to an on-chip component at the second side of the chip; or (3) directly electrically connected to an on-chip component at the second side of the chip.

Also disclosed herein is a method that uses any of the above-described chip carriers to test a chip and, particularly, to test components of the chip including, but not limited to, through-substrate vias (TSVs). This method can comprise providing any of the chip carriers, described above. That is, the provided chip carrier can comprise at least a base having a first surface and a second surface opposite the first surface, wherein the first surface has a chip attach area and the chip attach area has at least one opening that extends from the first surface to the second surface. The chip carrier can further comprise multiple wire bond pads, wherein the wire bond pads comprise first wire bond pads on the first surface and second wire bond pads on the second surface. The chip carrier can further comprise multiple input/output pins adjacent to the base, wherein the input/output pins are each longer than the thickness of the base and are each electrically connected to a first wire bond pad on the first surface and a second wire bond pad on the second surface.

The method can further comprise providing a chip that has a first side (e.g., a top) and a second side (e.g., a bottom) opposite the first side. Optionally, the chip can comprise multiple additional wire bond pads, wherein the additional wire bond pads comprise additional first wire bond pads on the first side of the chip (e.g., on the top of the chip) and additional second wire bond pads on the second side of the chip (e.g., on the bottom of the chip).

The method can further comprise attaching the second side of the chip to the chip attach area such that at least a portion of the second side is exposed within the opening(s). Next, selected first wire bond pads on the first surface of the base of the chip carrier can be electrically connected to the first side of the chip and selected second wire bond pads on the second surface of the base of the chip carrier can be electrically connected through the opening(s) to the second side of the chip. That is, first wires can be used to electrically connect any of the first wire bond pads on the first surface of the base of the chip carrier to the first side of the chip (e.g., to the top of the chip) and, particularly, to any of the following: (1) to an additional first wire bond pad, which is on the first side of the chip and which is electrically connected to an on-chip component; (2) to a probe, which is electrically connected to an on-chip component at the first side of the chip; or (3) directly to an on-chip component at the first side of the chip. Additionally or alternatively, because of the opening(s) in the chip attach area, second wires can be used to electrically connect any of the second wire bond pads on the second surface of the base of the chip carrier to the second side of the chip (e.g., to the bottom of the chip) through the opening(s) and, particularly, to any of the following: (1) to an additional second wire bond pad, which is on the second side of the chip and which is electrically connected to an on-chip component; (2) to a probe, which is electrically connected to an on-chip component at the second side of the chip; or (3) directly to an on-chip component at the second side of the chip.

Then, input/output pins of the chip carrier can be electrically coupled to an off-chip tester and the off-chip tester can be used to test at least one component (e.g., a device, a metal component or interconnect, such as a wire, a via, or a through-substrate via (TSV), etc.) of the chip.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1A:
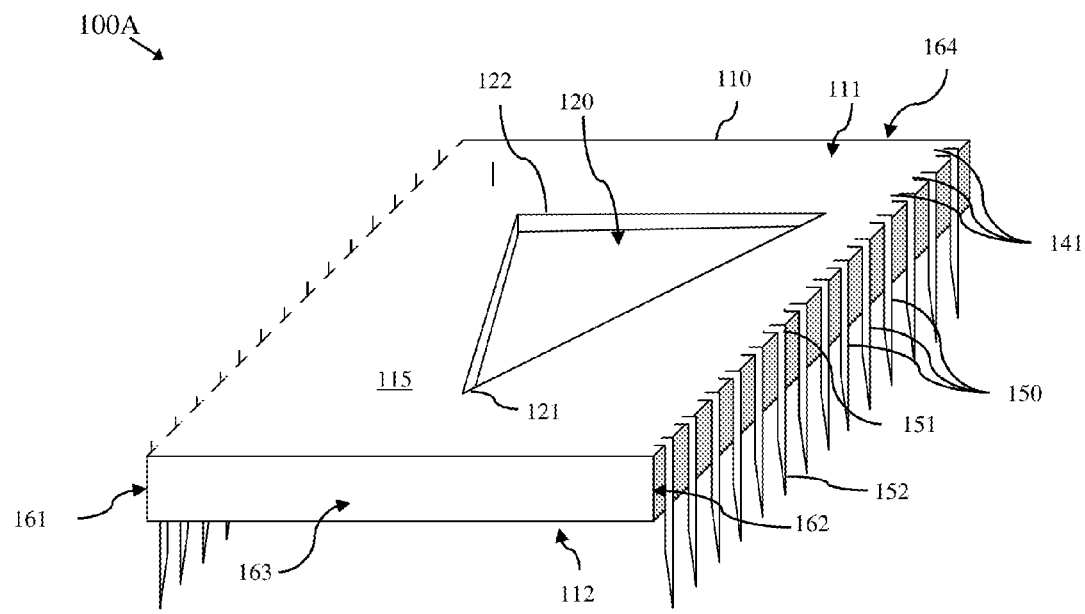
FIGS. 1A-1B are different perspective view drawings showing the top and bottom, respectively, of a chip carrier with dual-sided chip access for testing.

As mentioned above, electromigration is a failure mechanism that is associated with metal components of a chip (also referred to herein as an integrated circuit (IC) chip or a die). Specifically, electromigration is a condition in which atoms of a metal component or interconnect (e.g., a wire, a via, a through-substrate via (TSV), etc.) are displaced due to passing current. The condition is accelerated when the metal component is exposed to high temperatures and/or high currents and, over time, this condition can cause cracks (i.e., voids, opens, etc.) in the metal component that result in increased resistance and, ultimately, in failure of the metal component. Typically, the reliability of a metal component on a chip is tested using a chip carrier (e.g., a temporary chip attach (TCA) chip carrier). The chip carrier can have a support surface, wire bond pads on the support surface and input/output (I/O) pins electrically connected to the wire bond pads. A chip can be attached to the support surface and wires that are wire bonded to selected chip carrier wire bond pads can be electrically connected to opposite ends of the metal component in any one of several possible ways including, for example: (1) the wires can be directly electrically connected to the opposite ends of the metal component; (2) the wires can be wire bonded to on-chip wire bond pad that are electrically connected to the opposite ends; or (3) the wires can be electrically connected to probes that are in contact with the opposite ends of the metal component. The I/O pins allow for communication with an off-chip tester. Through these electrical connections, the off-chip tester can stress the metal component and, particularly, can subject the metal component to high temperatures and/or high currents and can test the performance of the metal component (e.g., can determine changes in the resistance of the metal component over time and/or can determine the time to fail (TTF) for the metal component). However, for through-substrate vias (TSVs) this reliability testing technique cannot be used because TSVs have opposite ends on opposite sides (e.g., the top and bottom) of the chip.

In view of the foregoing, disclosed herein are chip carriers that provide dual-sided chip access for testing. Specifically, each chip carrier can comprise a base with opposite surfaces (i.e., a first surface and second surface opposite the first surface) and wire bond pads on those opposite surfaces. Additionally, the first surface of the base can have a chip attach area with at least one opening that extends from the first surface to the second surface. A chip can be attached to the chip attach area and, because of the opening(s), both sides of the chip (i.e., the top and bottom of the chip) are accessible for testing. That is, wire bond pads on the first surface of the base of the chip carrier can be electrically connected to one side of the chip (e.g., to the top of the chip) and/or wire bond pads on the second surface of the base of the chip carrier can be electrically connected through the opening(s) to the opposite side of the chip (e.g., to the bottom of the chip). Also disclosed herein is a method that uses a chip carrier that provides dual-sided chip access to test a chip and, particularly, to test components of the chip including, but not limited to, through-substrate vias (TSVs).

Figure 1B:
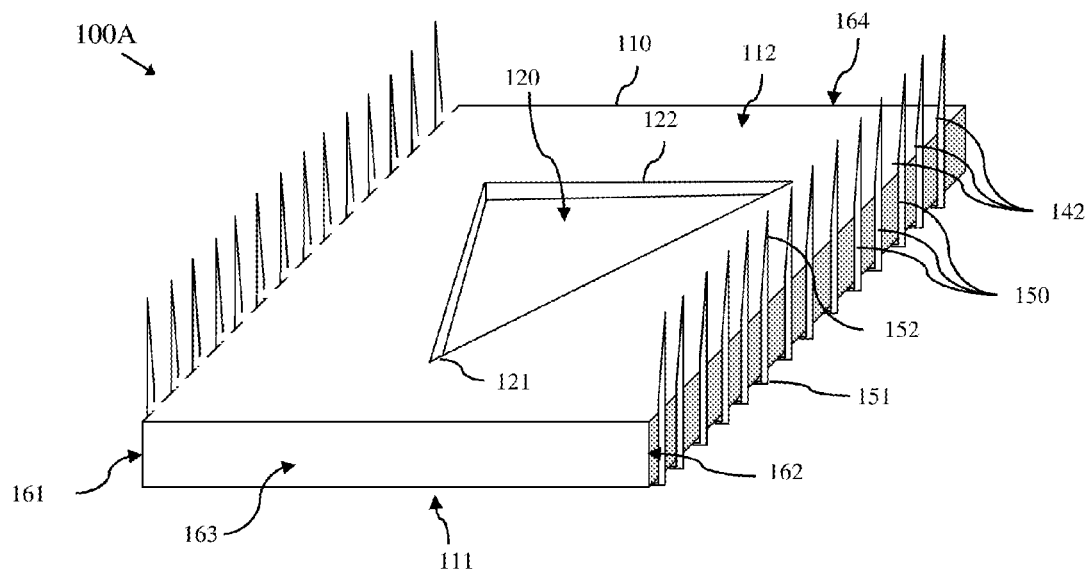
Figure 2A:
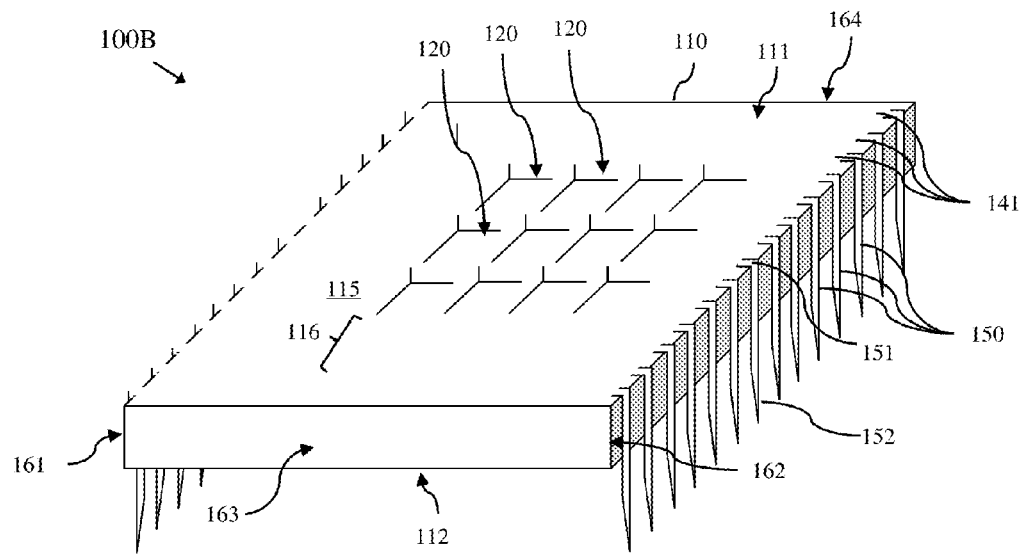
FIGS. 2A-2B are different perspective view drawings showing the top and bottom of another chip carrier with dual-sided chip access for testing.
Figure 2B:
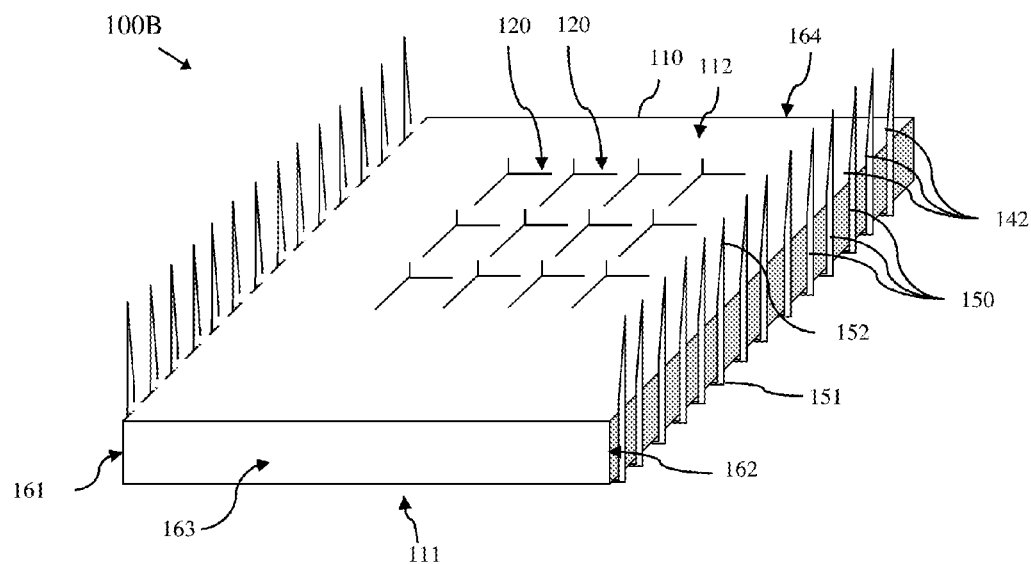

More particularly, referring to FIGS. 1A-1B and 2A-2B disclosed herein are chip carriers 100A and 100B, respectively. Each of these chip carriers 100A and 100B provide dual-sided chip access for testing of on-chip components including, for example, devices, metal components or interconnects, such as wires, vias, or through-substrate vias (TSVs), etc. Specifically, each of the chip carriers 100A and 100B comprise a base 110. The base 110 can be essentially rectangular in shape with opposing edges 161-162 and opposing ends 163-164. The base 110 can comprise, for example, a relatively hard insulating material such as a molded plastic or a ceramic material. In any case, the base 110 can have a first surface 111 and a second surface 112 opposite the first surface 111. FIG. 1A shows a perspective view of the chip carrier 100A looking down on the first surface 111 of the base 110, whereas FIG. 1B shows a perspective view of the same chip carrier 100A looking down on the second surface 112 of the base 110. Similarly, FIG. 2A shows a perspective view of the chip carrier 100B looking down on the first surface 111 of the base 110, whereas FIG. 2B shows a perspective view of the same chip carrier 100B looking down on the second surface 112 of the base 110.

In each of the chip carriers 100A and 100B, the first surface 111 of the base 110 can have a center portion and an outer portion laterally surrounding the center portion. The center portion of the first surface 111 of the base 110 can comprise a chip attach area 115. For purposes of this disclosure, it should be understood that a chip attach area 115 is an area of a chip carrier on to which a bare chip (also referred to herein as a bare or unpackaged integrated circuit (IC) chip or die) can be attached using, for example, an adhesive (e.g., an epoxy adhesive) or a clamping mechanism (not shown). The center portion and outer portion of the first surface 111 of the base 110 can be co-planar. Alternatively, the center portion can be recessed relative to the outer portion such that the chip attach area 115 is recessed, as illustrated, in order to provide structural protection for any chip attached to the chip attach area 115. The chip attach area 115 can have at least one opening 120 (also referred to herein as a channel) that extends vertically from the first surface 111 to the second surface 112.

Figure 3A:
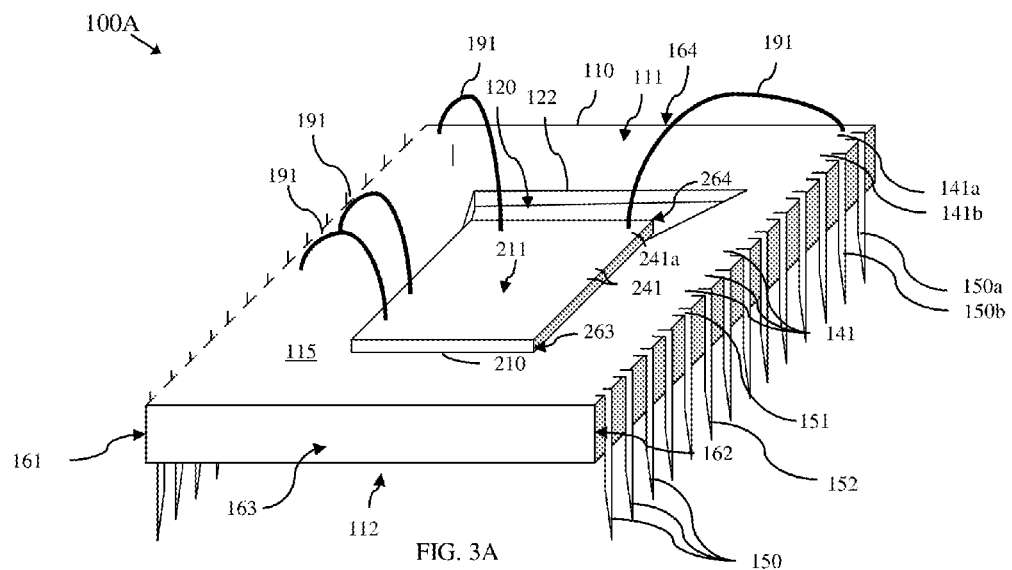
FIGS. 3A-3B are different perspective view drawings showing the top and bottom, respectively, of the chip carrier of FIGS. 1A-1B when carrying a chip.
Figure 3B:
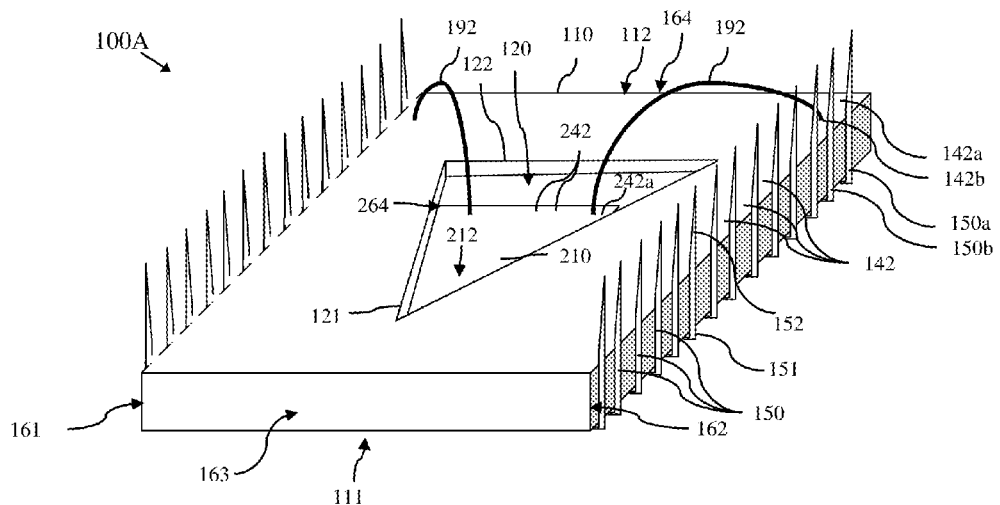

As illustrated in the chip carrier 100A of FIGS. 1A-1B, the at least one opening 120 can comprise a single opening with a non-uniform width (i.e., a variable width or, more specifically, a width that varies across the length of the base 110 between the opposing ends 163-164). For example, the single opening can be a triangular opening (i.e., the single opening can be essentially triangular in shape). In this case, one side 122 of the triangular opening can be adjacent to one end 164 of the base 110 of the chip carrier 100A and the apex 121 of the triangular opening opposite the side 122 can be adjacent to the opposite end 163 of the base 110 of the chip carrier 100A. As illustrated in FIGS. 3A-3B, a chip 210 can be positioned on and attached (e.g., by an adhesive, such as an epoxy adhesive, or by clamps (not shown)) to the chip attach area 115 such that a first edge 263 of the chip 210 is adjacent to the apex 121 of the triangular opening (i.e., at the end 163 of the base 110) and such that a second edge 264 of the chip 210 opposite the first edge 263 extends across (i.e., traverses) the triangular opening at some point between the apex 121 and the side 122, depending upon the length of the chip 210. Support is provided across the length of the chip 210 by those portions of the chip attach area 115, which form the two sides of the opening that merge at the apex 121.

Figure 4A:
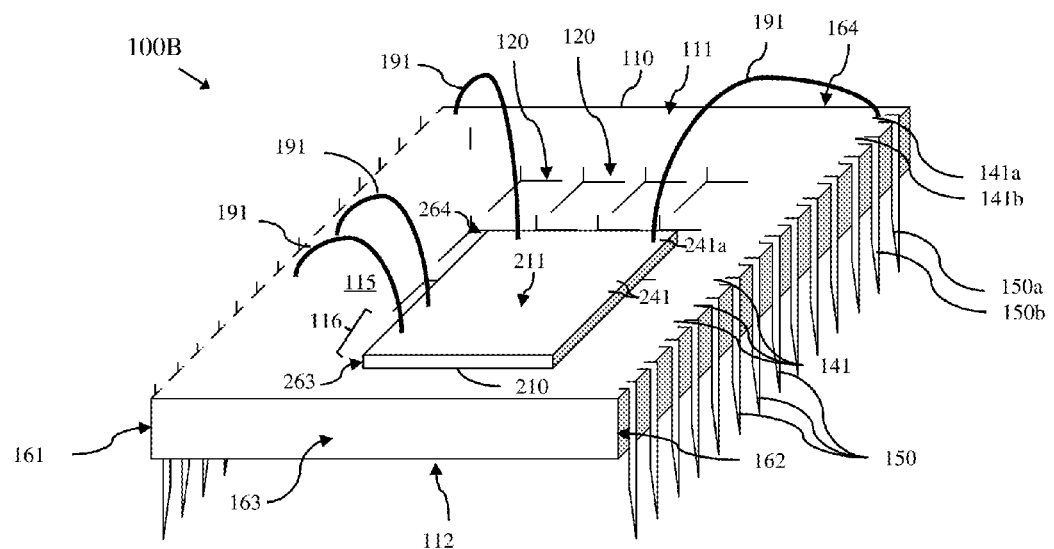
FIGS. 4A-4B are different perspective view drawings showing the top and bottom, respectively, of the chip carrier of FIGS. 2A-2B when carrying a chip.
Figure 4B:
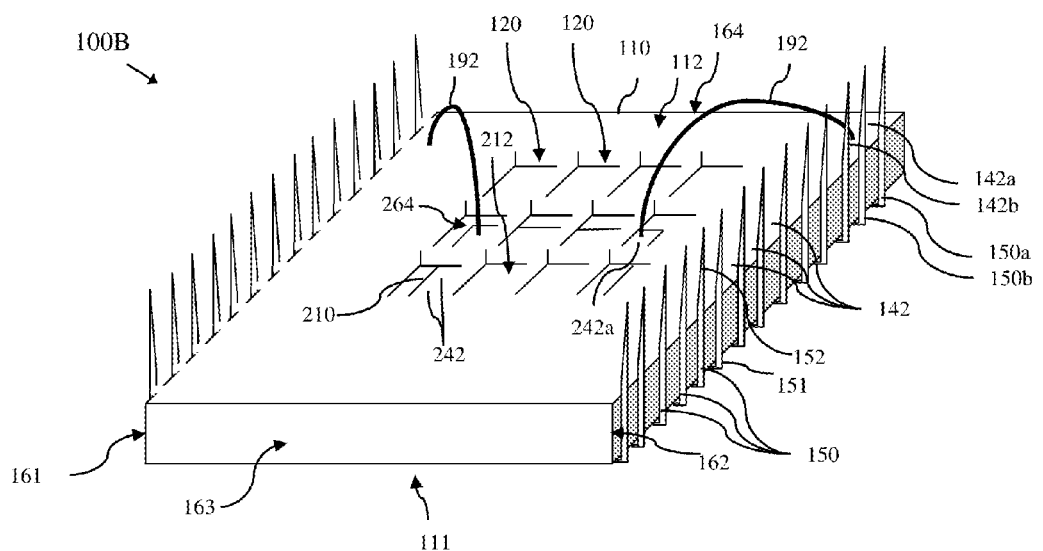

Alternatively, as illustrated in the chip carrier 100B of FIGS. 2A-2B, the at least one opening 120 can comprise multiple openings arranged in a grid pattern (i.e., in columns and rows). This grid pattern can extend from one end 164 of the base 110 toward the opposite end 163 of the base 110, leaving intact at least a portion 116 of the chip attach area 115 between openings and the end 163. The openings can be essentially rectangular in shape (i.e., rectangular openings), as illustrated. Alternatively, the openings can have any other suitable shape. For example, they can be circular in shape, hexagonal in shape, etc. The distance between the openings within the grid pattern can be relatively small (e.g., less than ¼ the width of the openings, less than ⅒ the width of the openings, etc.). As illustrated in FIGS. 4A-4B, a chip 210 can be positioned on and attached (e.g., by an adhesive, such as an epoxy adhesive, or by clamps (not shown)) to the portion 116 of the chip attach area 115 between openings and the end 163 of the base 110 such that a first edge 263 of the chip 210 is adjacent the end 163 of the base 110 and such that a second edge 264 of the chip 210 opposite the first edge 263 extends across (i.e., traverses) one or more openings in a given row of the grid pattern, depending upon the length of the chip 210. Support for the chip 210 is provided by the portion 116 of the chip attach area 115 between the openings and the end 163 of the base 110 in combination with the portions of the chip attach area 115 remaining intact between each of the openings.

It should be noted that, due to configuration of the opening(s) 120 and, particularly, the triangular shape of the opening in the chip carrier 100A of FIGS. 1A-1B and the grid pattern of openings in the chip carrier 100B of FIGS. 2A-2B, the chip carriers 100A and 100B can accommodate chips of various different sizes (see the more detailed discussion below with regard to method).

Referring again to FIGS. 1A-1B and 2A-2B, the chip carriers 100A and 100B can each further comprise multiple wire bond pads. These wire bond pads can comprise first wire bond pads 141 on the first surface 111 and second wire bond pads 142 on the second surface 112. Optionally, these wire bond pads can be arranged in rows on the first and second surfaces 111-112 of the base 110. For example, on the first surface 111, one or more rows of first wire bond pads 141 can be positioned at one or both of the opposing edges 161-162. Similarly, on the second surface 112, one or more rows of second wire bond pads 142 can be positioned at one or both of the opposing edges 161-162.

For illustration purposes, the Figures show a single row of wire bond pads on each surface 111-112 positioned at each of the opposing edge 161-162. However, it should be understood that the Figures are not intended to be limiting and, alternatively, a single row of wire bond pads on each surface 111-112 at one edge or multiple rows of wire bond pads on each surface 111-112 at one or both of the opposing edges 161-162 could be used. Furthermore, for illustration purposes, the Figures show a total of 28 wire bond pads on each surface 111-112 of the base 110. However, it should again be understood that the Figures are not intended to be limiting and, alternatively, any number of wire bond pads could be used on the first and surfaces 111-112. Those skilled in the art will recognize that a wire bond pad is a metal pad (e.g., an essentially rectangular or square shaped metal pad) that comprises one or more conductive metal layers. These metal layer(s) can comprise copper, gold, nickel, aluminum, tungsten, titanium, or alloys thereof.

The chip carriers 100A and 100B can each further comprise multiple input/output pins 150 (also referred to herein as leads or external connectors) adjacent to the base 110. These input/output pins 150 can comprise metal wires (e.g., coated copper wires, tinned copper wires or any other suitable electrically conductive wire). These input/output pins 150 can each be electrically connected to a first wire bond pad 141 on the first surface 111 and a second wire bond pad 142 on the second surface 112 and vertically aligned with the first wire bond pad 141. Thus, for example, if the first wire bond pads 141 on the first surface 111 are positioned in rows at the opposing edges 161-162 and the second wire bond pads 142 on the second surface 112 are similarly positioned in rows at the opposing edges 161-162, the input/output pins 150 can also be arranged in rows on the opposite edges 161-162 of the base 110 with each input/output pin being electrically connected to two vertically aligned wire bond pads (i.e., a first wire bond pad 141 and a second wire bond pad 142) on the first and second surfaces 111, 112, respectively. It should be noted that the rows of input/output pins 150 can be positioned laterally immediately adjacent to an essentially planar sidewall of the base 110, as illustrated. Alternatively, for added structural protection, the opposite edges 161-162 of the base 110 can have grooves or through-holes and the input/output pins 150 can extend vertically through the grooves or through-holes (not shown).

In any case, the input/output pins 150 can each be longer than the thickness of the base 110 in order to allow for electrical coupling with an off-chip tester. For example, each input/output pin 150 can have a first end 151 electrically connected to a first wire bond pad 141 at the first surface 111 of the base 110, a center section electrically connected to a second wire bond pad 142 on the second surface 112 of the base 110, and a second end 152 that is opposite the first end 151 and that extends beyond the second surface 112 of the base 110. Having the input/output pins 150 longer than the thickness of the base 110 such that they extend beyond the second surface 112 ensures that these input/output pins 150 can subsequently be inserted into a test socket on a printed wiring board (PWB) (also referred to herein as a printed circuit board (PCB)) or through-hole soldered directly onto a PWB.

As illustrated in FIGS. 3A-3B and 4A-4B and discussed above, the chip attach area 115 of the chip carriers 100A and 100B can support a chip 210 such that the second edge 264 of the chip 210 traverses the triangular opening in the case of chip carrier 100A or one or more openings in a row of openings in the case of chip carrier 100B.

The above-described chip carriers 100A and 100B are configured to allow any of the first wire bond pads 141 on the first surface 111 of the base 110 of the chip carrier 100 to be electrically connected to a first side 211 of the chip 210 (e.g., to the top of the chip 210). For example, any first wire bond pad 141 on the first surface 111 of the base 110 of the chip carriers 100A and 100B can be electrically connected (e.g., by wire bonding) to a first wire 191 and, on the first side 211 of the chip 210, that first wire 191 can be electrically connected to an on-chip component (e.g., a device, a metal component or interconnect, such as a wire, via or through-substrate via (TSV), etc., within the chip 210) in any one of three different ways: (1) by wire bonding to an additional first wire bond pad 241, which is on the first side 211 of the chip 210 and which is electrically connected to the on-chip component (as shown); (2) by a probe, which is electrically connected between the first wire 191 and the on-chip component at the first side 211 of the chip 210 or (3) by a direct electrical connection to the on-chip component at the first side 211 of the chip 210.

Furthermore, because of the opening(s) 120, the above-described chip carriers 100A and 100B are also configured to allow any of the second wire bond pads 142 on the second surface 112 of the base 110 of the chip carrier 100 to be electrically connected to a second side 212 of the chip 210 (e.g., to the bottom of the chip) through the opening(s) 120. For example, any second wire bond pad 142 on the second surface 112 of the base 110 of the chip carriers 100A and 100B can be electrically connected (e.g., by wire bonding) to a second wire 192 and, on the second side 212 of the chip 210, that second wire 192 can be electrically connected through the opening(s) 120 to an on-chip component (e.g., a device, a metal component or interconnect, such a wire, a via or a through-substrate via (TSV), etc., within the chip 210) in any one of three different ways: (1) by wire bonding to an additional second wire bond pad 242, which is on the second side 212 of the chip 210 exposed within the opening(s) 120 and which is electrically connected to the on-chip component (as shown); (2) by a probe, which is electrically connected between the second wire 192 and the on-chip component at the second side 212 of the chip 210, or (3) by a direct electrical connection to the on-chip component at the second side 212 of the chip 210.

Therefore, the chip carriers 100A and 100B can be used to test an on-chip component of the chip 210 from above only, from below only or from both.

Specifically, the chip carriers 100A and 100B can be used to test a first component (e.g., a device, a metal component or interconnect, such as a wire or via, etc.) of a chip from above only. In this case, two first wires 191 would be wire bonded to two first wire bond pads 141 on the first surface 111 of the base 110 of the chip carrier and would further be electrically connected to opposite ends, respectively, of the first component (e.g., via additional first wire bond pads 241 on the first side 211 of the chip 210 (as shown), via probes or directly).

Additionally or alternatively, the chip carriers 100A and 100B can be used to test a second component (e.g., a device, a metal component or interconnect, such as a wire or via, etc.)

of the chip 210 from below only. In this case, two second wires 192 would be wire bonded to two second wire bond pads 142 on the second surface 112 of the base 110 of the chip carrier and further electrically connected to opposite ends, respectively, of the second component (e.g., via additional second wire bond pads 242 on the second side 212 of the chip 210 (as shown), via probes or directly).

Additionally or alternatively, the chip carriers 100A and 100B can be used to test a third component of the chip 210 from both above and below, if necessary. Testing from both above and below can, for example, be necessary when the third component comprises a through-substrate via (TSV) that extends vertically between opposite sides 211 and 212 of the chip 210. A TSV can, for example, extend vertically between and be electrically connected to two vertically aligned wire bond pads (e.g., an additional first wire bond pad 241a on the first side 211 of the chip 210 and an additional second wire bond pad 242a on the second side 212 of the chip 210). In this case, in order to test that TSV, a first wire bond pad 141a, which is on the first surface 111 of the base 110 of the chip carrier 100A or 100B and which is electrically connected to an input/output pin 150a, can be electrically connected to an additional first wire bond pad 241a by a first wire 191 and a second wire bond pad 142b, which is on the second surface 112 of the base 110 of the chip carrier 100A or 100B and which is electrically connected to a different input output pin 150b, can be electrically connected to the additional second wire bond pad 242a by a second wire 192 (as shown). Alternatively, although not shown, a TSV can have exposed ends at the opposite sides 211-212 of the chip 210. In this case, in order to test the TSV, a first wire bond pad 141a, which is on the first surface 111 of the base 110 of the chip carrier 100A or 100B and which is electrically connected to an input/output pin 150a, can be electrically connected to one end of the TSV by a first wire 191 either via a probe or directly and a second wire bond pad 142b, which is on the second surface 112 of the base 110 of the chip carrier 100A or 100B and which is electrically connected to a different input output pin 150b, can be electrically connected to the opposite end of the TSV by a second wire 192 either via a probe or directly.

Figure 5:
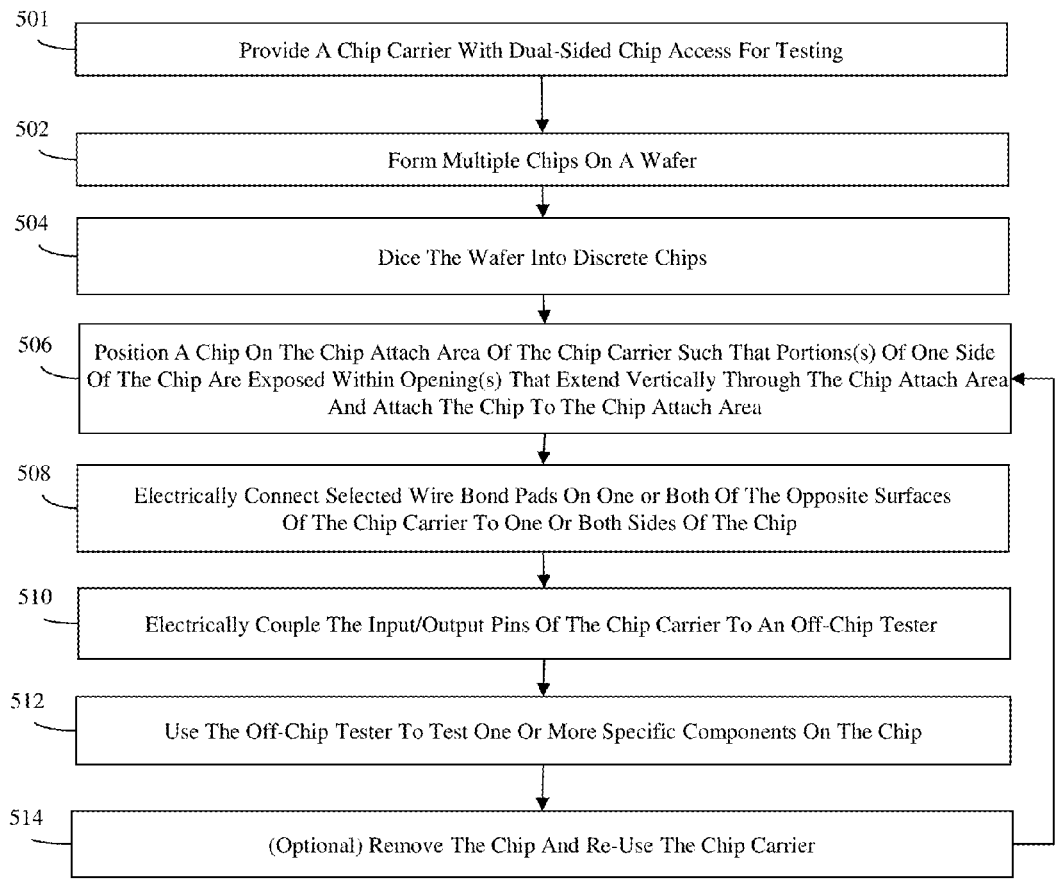
FIG. 5 is a flow diagram illustrating a method of testing a chip using a chip carrier with dual-sided access.

Referring to FIG. 5, also disclosed herein is a method that uses any of the above-described chip carriers 100A of FIGS. 1A-1B or 100B of FIGS. 2A-2B to test a chip and, particularly, to test one or more components (e.g., devices, metal components or interconnects, such wires, vias, or through-substrate vias (TSVs), etc.) of the chip.

The method can comprise providing any of the chip carriers 100A or 100B, which, as discussed in detail above, provide dual-sided chip access for testing (501). Specifically, the provided chip carrier 100A or 100B can comprise at least a base 110 having a first surface 111 and a second surface 112 opposite the first surface 111, wherein the first surface 111 has a chip attach area 115 and the chip attach area 115 has at least one opening 120 that extends from the first surface 111 to the second surface 112. The opening(s) 120 can comprise a single opening with a non-uniform width (e.g. see the triangular opening of the chip carrier 100A of FIGS. 1A-1B) or multiple openings arranged in a grid pattern (e.g., see the rectangular shaped opening arranged in columns and rows in the chip carrier 100B of FIGS. 2A-2B). The chip carrier 100A or 100B can further comprise multiple wire bond pads, wherein the wire bond pads comprise first wire bond pads 141 on the first surface 111 and second wire bond pads 142 on the second surface. The chip carrier 100A or 100B can further comprise multiple input/output pins 150 adjacent to the base 110, wherein the input/output pins 150 are each longer than the thickness of the base 110 and are each electrically connected to a first wire bond pad 141 on the first surface 111 and a second wire bond pad 142 on the second surface 112.

The method can further comprise forming multiple chips (also referred to herein as integrated circuit (IC) chip or dies) on a wafer and dicing the wafer into discrete chips (502)-(504). Each chip can be formed so as to have a first side and a second side opposite the first side (e.g., a top and a bottom opposite the top). Each chip can further be formed so as to comprise multiple components comprising, for example, devices (e.g., diodes, transistors, capacitors, etc.) and other components including, but not limited to, metal components or interconnects (e.g., wires, vias, or through-substrate vias (TSVs)), etc. Optionally, each chip can further be formed so as to have multiple additional wire bond pads, wherein the additional wire bond pads comprise additional first wire bond pads on the first side of the chip (e.g., on the top of the chip) and additional second wire bond pads on the second side of the chip (e.g., on the bottom of the chip). Techniques for forming chips on a wafer and dicing the wafer to form discrete chips are well known in the art and, thus, the details have been omitted from this specification in order to allow the reader to focus on the salient aspects of the disclosed method.

The method can further comprise positioning one of the chips (e.g., chip 210) on the chip attach area 115 of the chip carrier 100A or 100B, as discussed in greater detail below, and once the chip 210 is properly positioned, attaching the chip 210 to the chip attach area 115. Attachment of the chip 210 to the chip attach area 115 can be achieved, for example, using an adhesive, such as an epoxy adhesive, or by clamping (not shown). This attachment can be designed to be permanent (e.g., when the chip under test and carrier are to be disposed of following testing) or temporary (e.g., when the chip carrier is to be re-used following testing). Temporary chip attachment can, for example, be achieved with a re-flowable epoxy adhesive and/or with clamping.

Positioning of the chip 210 on the chip attach area 115 should be performed such that at least portion(s) of the second side 212 of the chip 210 is/are exposed within the opening(s) 120 (506, see FIGS. 3A-3B and FIGS. 4A-4B). The exposed portion(s) of the second side 212 of the chip 210 can have thereon additional second wire bond pads 242 (as shown), which are electrically connected to specific on-chip components to be tested. Additionally or alternatively, the exposed portions(s) of the second side 212 of the chip 210 can contain exposed ends of the specific on-chip components to be tested.

For purposes of illustration, the positioning process is described in greater detail below and shown in the Figures with respect to the exposed portions on the second side 212 of the chip 210 having additional second wire bond pads 242 thereon.

Figure 6A:
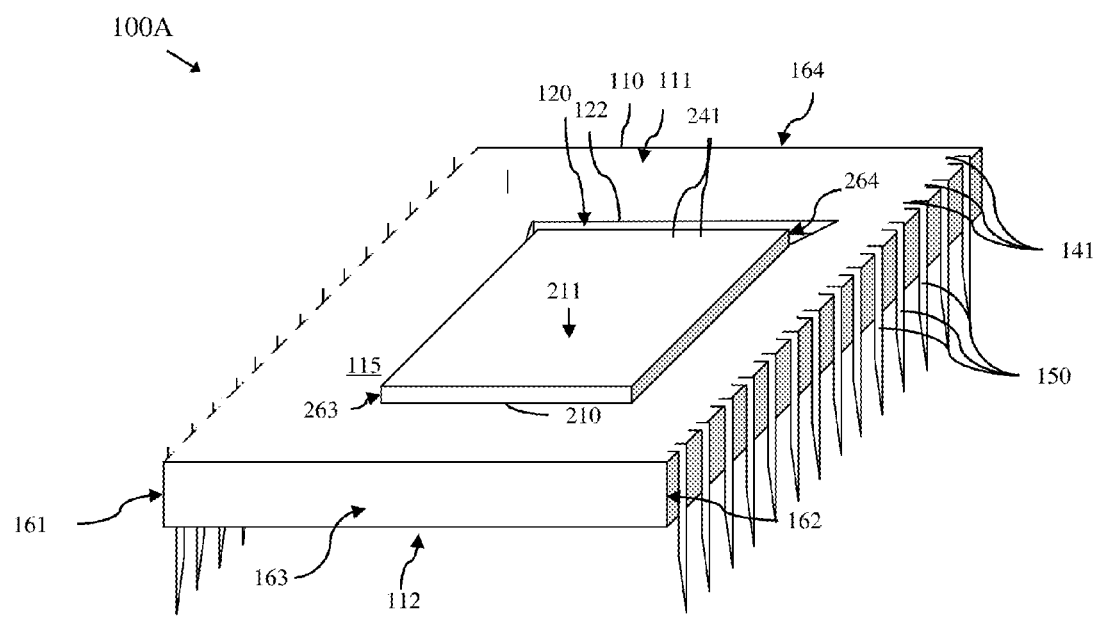
FIGS. 6A-6B are different perspective view drawings showing the top and bottom, respectively, of the chip carrier of FIGS. 1A-1B when carrying a different size chip.
Figure 6B:
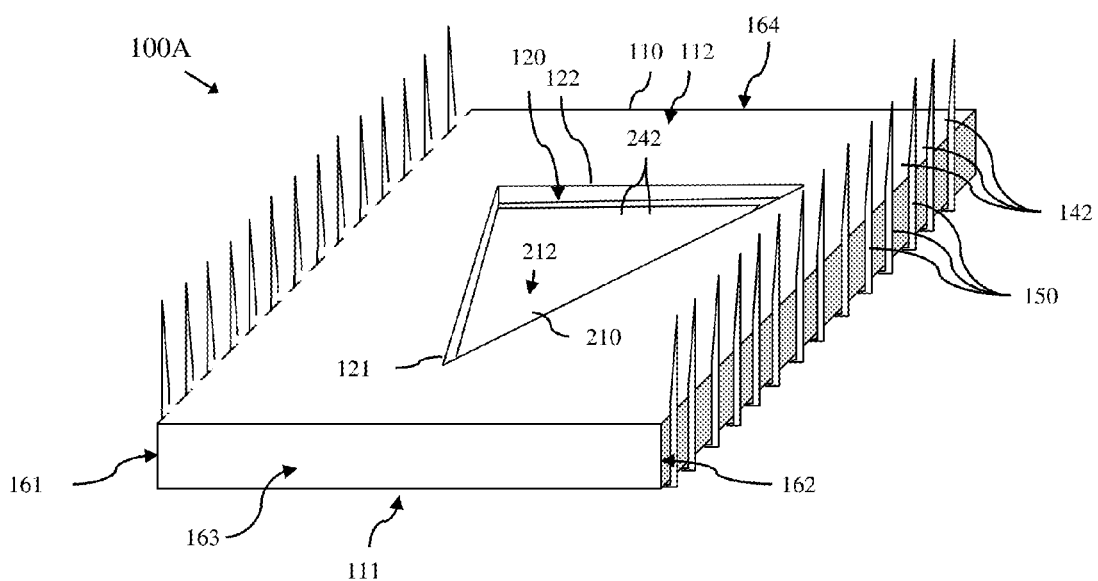

When using the chip carrier 100A of FIGS. 1A-1B, the chip 210 can be positioned on and attached to the chip attach area 115. In any case, attachment should be such that a first edge 263 of the chip 210 is adjacent to the apex 121 of the triangular opening (i.e., adjacent to the end 163 of the base 110) and such that a second edge 264 of the chip 210 opposite the first edge 263 extends across (i.e., traverses) the triangular opening at some point between the apex 121 of the triangular opening and side 122 of the triangular opening opposite that apex 121, depending upon the length of the chip 210 (see FIGS. 3A-3B). As a result, at least some additional second wire bond pads 242, which are on the second side 212 of the chip 210 adjacent to the second edge 264 and which are electrically connected to specific components to be tested, should be exposed within the triangular opening (as shown). Additionally or alternatively, exposed ends of specific components to be tested can be exposed within the triangular opening (not shown). It should be noted that, due to the essentially triangular shape of the opening, the chip carrier 100A can accommodate and support chips of various different sizes. Specifically, a relatively short chip 210 will extend out a lesser distance over the triangular opening from the apex 121 such that the second edge 264 of that chip 210 traverses only a relatively narrow portion of the triangular opening (as shown in FIGS. 3A-3B), whereas a relatively long chip will extend out further over the triangular opening from the apex 121 such that the second edge 264 of the chip 210 traverses a relatively wide portion of the triangular opening (as shown in FIGS. 6A-6B). In either case, support is provided across the length of the chip 210 by those portions of the chip attach area 115, which form the two sides of the triangular opening that merge at the apex 121.

Figure 7A:
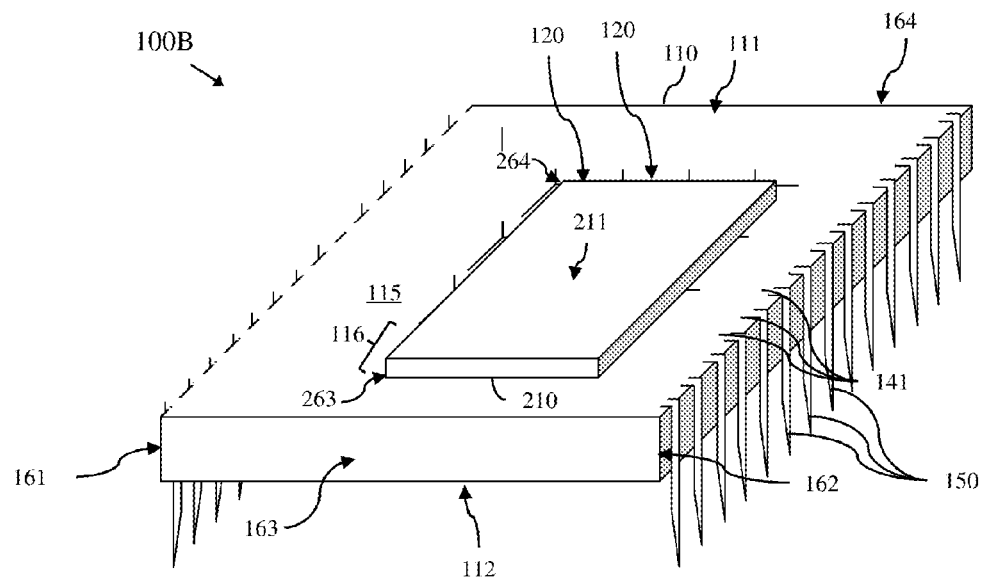
FIGS. 7A-7B are different perspective view drawings showing the top and bottom, respectively, of the chip carrier of FIGS. 2A-2B, when carrying a different size chip.
Figure 7B:
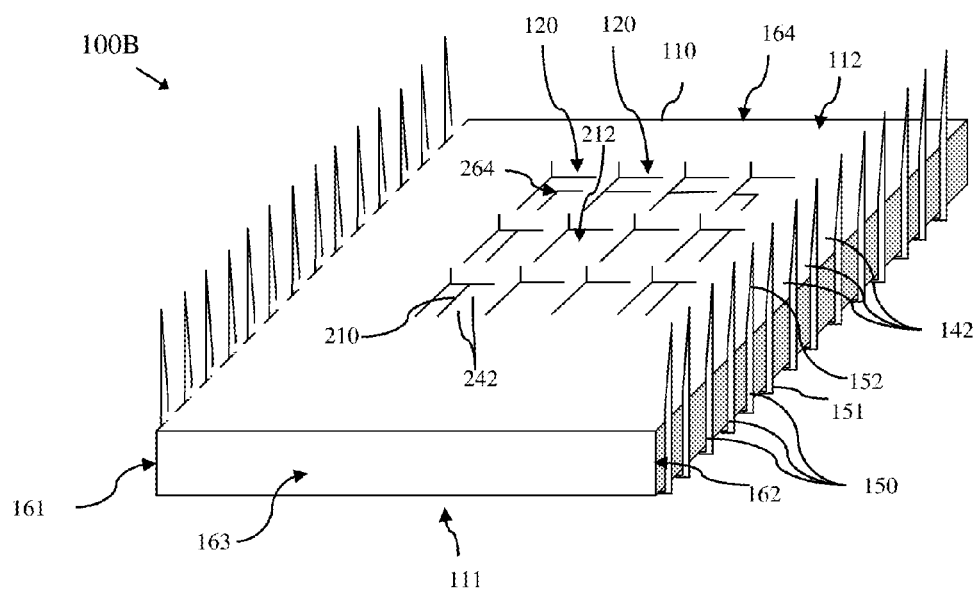

Similarly, when using the chip attach carrier 100B of FIGS. 2A-2B, the chip 210 can be positioned on and attached to the portion 116 of the chip attach area 115 between the openings and the end 163 of the base 110 such that a first edge 263 of the chip 210 is adjacent to the end 163 of the base 110 and such that a second edge 264 of the chip 210 opposite the first edge 263 extends across (i.e., traverses) one or more openings in a given row, depending upon the length of the chip 210 (see FIGS. 4A-4B). As a result, at least some of the additional second wire bond pads 242, which are on the second side 212 of the chip 210 adjacent to the second edge 264 and which are electrically connected to specific components to be tested, should be exposed within the openings in the given row. Additionally or alternatively, exposed ends of specific components to be tested could be exposed within the openings in the given row (not shown). It should be noted that, due to the multiple openings in the grid pattern, the chip carrier 100B can accommodate and support chips of various different sizes. Specifically, a relatively short chip 210 will extend out a lesser distance over the grid pattern such that the second edge 264 of that chip 210 traverses one or more openings in a row of openings closer to the end 163 of the base 110 (as shown in FIGS. 4A-4B), whereas a relatively long chip will extend out further over the grid pattern of openings such that the second edge 264 of the chip 210 traverses one or more openings in a row of openings farther from the end 163 of the base 110 (as shown in FIGS. 7A-7B). In either case support for the chip 210 is provided by the portion 116 of the chip attach area 115 between the openings and the end 163 of the base 110 in combination with the portions of the chip attach area 115 remaining intact between each of the openings.

It should be noted that, regardless of the chip carrier 100A or 100 B used, before the chip 210 is attached to the chip attach area 115 at process 506, the chip 210 should be positioned such that the second edge 264 is the correct edge for testing specific component(s) (e.g., specific device(s), specific metal component(s) or interconnect(s), such as specific wire(s), specific via(s) or specific through-substrate via(s) (TSV(s)), etc.) on the chip 210. For example, the second edge 264 should contain thereon any specific additional second wire bond pad(s) 242 that are electrically connected to the specific component(s) to be tested so that specific additional second wire bond pad(s) 242 and, thereby the specific component(s) will be accessible for testing through the opening(s) 120. Additionally or alternatively, the second edge 264 should contain exposed ends of specific components to be tested.

Next, selected first wire bond pads 141 on the first surface 111 of the base 110 of the chip carrier 100A or 100B can be electrically connected to the first side 211 of the chip 210 and/or selected second wire bond pads 142 on the second surface 112 of the base 110 of the chip carrier 100A or 100B can be electrically connected through the opening(s) 120 to the second side 212 of the chip 210 (508, see FIG. 3A-3B or 4A-4B). For example, at process 508, any first wire bond pad 141 on the first surface 111 of the base 110 of the chip carriers 100A and 100B can be electrically connected (e.g., by wire bonding) to a first wire 191 and, on the first side 211 of the chip 210, that first wire 191 can be electrically connected to an on-chip component (e.g., a device or metal component, such as an interconnect, within the chip 210) in any one of three different ways: (1) by wire bonding to an additional first wire bond pad 241, which is on the first side 211 of the chip 210 and which is electrically connected to the on-chip component (as shown); (2) by a probe, which is electrically connected between the first wire 191 and the on-chip component at the first side 211 of the chip 210 or (3) by a direct electrical connection to the on-chip component at the first side 211 of the chip 210. Furthermore, because of the opening(s) 120, at process 508 any second wire bond pad 142 on the second surface 112 of the base 110 of the chip carriers 100A and 100B can be electrically connected (e.g., by wire bonding) to a second wire 192 and, on the second side 212 of the chip 210, that second wire 192 can be electrically connected through the opening(s) 120 to an on-chip component (e.g., a device or metal component, such as an interconnect, within the chip 210) in any one of three different ways: (1) by wire bonding to an additional second wire bond pad 242, which is on the second side 212 of the chip 210 exposed within the opening(s) 120 and which is electrically connected to the on-chip component (as shown); (2) by a probe, which is electrically connected between the second wire 192 and the on-chip component at the second side 212 of the chip 210, or (3) by a direct electrical connection to an the on-chip component at the second side 212 of the chip 210.

It should be noted that in wire bonding, as referenced above, a bond wire comprising, for example, aluminum, copper, silver, gold or any other suitable conductivity material and having a diameter ranging from 10-200 μm can be bonded at one end to one wire bond pad and at its opposite end to another wire bond, thereby electrically connecting the wire bond pads. Those skilled in the art will recognize that wire-bonding techniques may vary depending upon the conductive metal used for the bond wire and/or the wire bond pad. Such techniques can include, but are not limited to, ball bonding, wedge bonding and compliant bonding. These techniques are well known in the art and, thus, the details have been omitted from this specification in order to allow the reader to focus on the salient aspects of the disclosed method.

Once the required electrical connections are made between the chip carrier 100A or 100B and the chip 210 at process 508, the input/output pins 150 of the chip carrier 100A or 100B can be electrically coupled to an off-chip tester (510). For example, the input/output pins 150 of the chip carrier 100A or 100B can be inserted into a test socket, which is mounted on a printed wire board (PWB) (also referred to herein as a printed circuit board (PCB)) and the PWB can be installed in the tester. Alternatively, the input/output pins 150 of the chip carrier 100A or 100B can be through-hole soldered directly onto a PWB and the PWB can be installed in the tester. Specific techniques for mounting chip carriers (e.g., temporary chip attach (TCA) carriers or other types of chip carriers) on a PWB (either indirectly through a test socket or directly by through-hole soldering) and for installing such a PWB into an off-chip tester are well known in the art and, thus, the details of such techniques have been omitted from this specification in order to allow the reader to focus on the salient aspects of the disclosed method.

Then, the off-chip tester can be used to test one or more specific components (e.g., device(s), metal component(s) or interconnect(s), such as wire(s), via(s) or through-substrate via(s) (TSV(s)), etc.) of the chip 210 from above, from below, or from both above and below, as necessary (512).

Those skilled in the art will recognize that component testing at process 512 will depend upon the electrical connections made at process 508. Specifically, in order to test one or more specific components (e.g., devices, metal components, such as interconnects or through-substrate vias, etc.) on the chip 210 at process 512, the electrical connections made at process 508 should provide the off-chip tester with access to the specific component(s) from above, from below or both. That is, as mentioned above, any of the first wire bond pads 141 on the first surface 111 of the base 110 of the chip carrier 100A or 100B can be electrically connected to the first side 211 of the chip 210 (e.g., to the top of the chip) and, because of the opening(s) 120 in the chip attach area 115, any of the second wire bond pads 142 on the second surface 112 of the base 110 of the chip carrier 100A or 100B can be electrically connected to the second side 212 of the chip 210 (e.g., to the bottom of the chip) through the opening(s) 120. Thus, for example, in order to test a first component of the chip 210 from above, two first wires 191 can be wire bonded to two first wire bond pads 141 on the first surface 111 of the base 110 of the chip carrier and can further be electrically connected on the first side 211 of the chip 210 to opposite ends, respectively, of a first component (e.g., via wire bonding to additional first wire bond pads 241 on the first side 211 of the chip 210 (as shown), via probes or directly). Additionally or alternatively, in order to test a second component of the chip 210 from below, two second wires 192 can be wire bonded to two second wire bond pads 142 on the second surface 112 of the base 110 of the chip carrier and can further be electrically connected on the second side 212 of the chip 210 to opposite ends, respectively, of the second component (e.g., via wire bonding to additional second wire bond pads 242 on the second side 212 of the chip 210 (as shown), via probes or directly). Additionally or alternatively, when the chip 210 comprises a through-substrate via (TSV) that extends vertically between opposite sides 211 and 212 of the chip 210 (i.e., between the top and bottom of the chip), the TSV can subsequently be tested at process 512 by ensuring that the opposite ends of the TSV are electrically connected to different input/output pins. For example, a first wire bond pad 141*a*, which is on the first surface 111 of the base 110 of the chip carrier 100A or 100B and which is electrically connected to the input/output pin 150*a*, can be electrically connected at process 508 to one end of the TSV (e.g., via wire bonding to an additional first wire bond pad 241*a* on the first side 211 of the chip immediately adjacent to the end of the TSV (as shown), via a probe or directly). Additionally, a second wire bond pad 142*b*, which is on the second surface 112 of the base 110 of the chip carrier 100A or 100B and which is electrically connected to a different input output pin 150*b*, is electrically connected at process 508 to the opposite end of the TSV (e.g., via wire bonding to an additional second wire bond pad 242*a* on the second side 212 of the chip and immediately adjacent to the opposite end of the TSV (as shown), via a probe or directly). It should be understood that in the above-described example, second wire bond pad 142*a*, which is vertically aligned with first wire bond pad 141*a* and also electrically connected to input/output pin 150*a*, will not be electrically connected to the TSV under test. Similarly, first wire bond pad 141*b*, which is vertically aligned with second wire bond pad 142*b* and also electrically connected to input/output pin 150*b*, will not be electrically connected to the TSV under test.

With the electrical connections provided between the chip 210 and chip carrier 100A or 100B, as described above, and with the electrical coupling between the chip carrier 100A or 100B and the off-chip tester, also as described above, the off-chip tester can test the various specific components of the chip simultaneously or individually. For each metal component or interconnect (e.g., wire, via or through-substrate via (TSV)) in particular such testing can comprise, for example, stressing the component over time (e.g., by applying a high temperature and/or a high voltage through the input/output pins electrically connected to the opposite ends that metal component) and determining the change in resistance in the component and/or determining the time to fail of the component due to electromigration.

Following testing of the chip 210 at process 512, the chip 210 and chip carrier 100A or 100B can be disposed. However, optionally, if the chip 210 was only temporarily attached to the chip carrier 100A or 100B, the chip 210 can be removed and the chip carrier 100A or 100B can be re-used (514). For example, if the chip 210 was attached to the chip attach area 115 of the chip carrier 100A or 100B by a re-flowable epoxy adhesive, the adhesive can be heated until reflow occurs and the chip 210 can be removed. Alternatively, if the chip 210 was attached to the chip attach area 115 by clamps, such clamps can be removed. In this case, processes 506-514 can be repeated for multiple different chips using the same chip carrier 100A or 100B and, as discussed above, due to the configuration of the opening(s) 120 in these chip carriers 100A and 100B, the different chips can have the same size or various different sizes.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "first side", "second side", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are chip carriers that provide dual-sided chip access for testing. Specifically, each chip carrier can comprise a base with opposite surfaces (i.e., a first surface and second surface opposite the first surface) and wire bond pads on those opposite surfaces. Additionally, the first surface of the base can have a chip attach area with at least one opening that extends from the first surface to the second surface. A chip can be attached to the chip attach area and, because of the opening(s), both sides of the chip (i.e., the top and bottom of the chip) are accessible for testing. That is, wire bond pads on the first surface of the base of the chip carrier can be electrically connected to one side of the chip (e.g., to the top of the chip) and/or wire bond pads on the second surface of the base of the chip carrier can be electrically connected through the opening(s) to the opposite side of the chip (e.g., to the bottom of the chip). Also disclosed herein is a method that uses a chip carrier that provides dual-sided chip access to test a chip and, particularly, to test components of the chip including, but not limited to, through-substrate vias (TSVs).

What is claimed is:

1. A chip carrier comprising:
    a base having a first surface and a second surface opposite said first surface, said first surface having a chip attach area and said chip attach area having at least one opening that extends from said first surface to said second surface; and,
    multiple wire bond pads comprising first wire bond pads on said first surface and second wire bond pads on said second surface,
    said chip attach area supporting a chip so as to allow any of said first wire bond pads to be electrically connected to a first side of said chip and so as to allow any of said second wire bond pads to be electrically connected to a second side of said chip through said at least one opening.

2. The chip carrier of claim 1, further comprising multiple input/output pins adjacent to said base, each input/output pin being longer than a thickness of said base and further being electrically connected to a first wire bond pad on said first surface and a second wire bond pad on said second surface.

3. The chip carrier of claim 1, said at least one opening comprising a single opening.

4. The chip carrier of claim 3, said single opening having a non-uniform width.

5. The chip carrier of claim 3, said single opening being essentially triangular in shape.

6. The chip carrier of claim 1, said at least one opening comprising multiple openings arranged in a grid pattern.

7. The chip carrier of claim 6, said multiple openings being any one of rectangular, circular, and hexagonal in shape.

8. A chip carrier comprising:
    a base having a first surface, a second surface opposite said first surface, and opposing edges, said first surface having a recessed chip attach area and said recessed chip attach area having at least one opening that extends from said first surface to said second surface;
    multiple wire bond pads comprising rows of first wire bond pads on said first surface at said opposing edges and rows of second wire bond pads on said second surface at said opposing edges; and,
    rows of input/output pins adjacent to said base at said opposing edges, each input/output pin being longer than a thickness of said base and further being electrically connected to a first wire bond pad on said first surface and a second wire bond pad on said second surface,
    said recessed chip attach area supporting a chip so as to allow any of said first wire bond pads to be electrically connected to a first side of said chip and any of said second wire bond pads to be electrically connected to a second side of said chip through said at least one opening.

9. The chip carrier of claim 8, said at least one opening comprising a single opening.

10. The chip carrier of claim 9, said single opening having a non-uniform width.

11. The chip carrier of claim 9, said single opening being essentially triangular in shape.

12. The chip carrier of claim 8, said at least one opening comprising multiple openings arranged in a grid pattern.

13. The chip carrier of claim 12, said multiple openings being any one of rectangular, circular, and hexagonal in shape.

14. A chip carrier comprising:
    a base having a first surface and a second surface opposite said first surface, said first surface having a chip attach area and said chip attach area having at least one opening that extends from said first surface to said second surface;
    multiple wire bond pads comprising first wire bond pads on said first surface and second wire bond pads on said second surface, said chip attach area supporting a chip so as to allow any of said first wire bond pads to be electrically connected to a first side of said chip and so as to allow any of said second wire bond pads to be electrically connected to a second side of said chip through said at least one opening; and,
    multiple input/output pins adjacent to said base, each input/output pin being longer than a thickness of said base and further being electrically connected to a first wire bond pad on said first surface and a second wire bond pad on said second surface.

15. The chip carrier of claim 14, said at least one opening comprising a single opening.

16. The chip carrier of claim 15, said single opening having a non-uniform width.

17. The chip carrier of claim 15, said single opening being essentially triangular in shape.

18. The chip carrier of claim 14, said at least one opening comprising multiple openings arranged in a grid pattern.

19. The chip carrier of claim 6, said multiple openings being any one of rectangular, circular, and hexagonal in shape.

* * * * *